(12) United States Patent
Kishimoto et al.

(10) Patent No.: US 7,143,772 B2
(45) Date of Patent: Dec. 5, 2006

(54) METHOD OF MANUFACTURING A CIRCUIT BOARD AND ITS MANUFACTURING APPARATUS

(75) Inventors: Kunio Kishimoto, Osaka (JP); Toshihiro Nishii, Osaka (JP); Toshiaki Takenaka, Kyoto (JP); Shinji Nakamura, Osaka (JP); Akihiro Miura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 166 days.

(21) Appl. No.: 10/733,283

(22) Filed: Dec. 12, 2003

(65) Prior Publication Data

US 2004/0126516 A1 Jul. 1, 2004

Related U.S. Application Data

(62) Division of application No. 09/736,499, filed on Dec. 15, 2000, now Pat. No. 6,820,331.

(30) Foreign Application Priority Data

Dec. 17, 1999 (JP) ............................. 11-359251

(51) Int. Cl.
*B08B 3/12* (2006.01)
(52) U.S. Cl. ................... 134/130; 134/133; 134/184; 134/902
(58) Field of Classification Search ................ 134/1.3, 134/15, 32, 124, 130, 133, 137, 184, 902
See application file for complete search history.

(56) References Cited

U.S. PATENT DOCUMENTS

| 4,635,358 A | 1/1987 | Fritz |
| 4,931,134 A | 6/1990 | Hatkevitz et al. |
| 4,964,948 A | 10/1990 | Reed |
| 5,145,572 A | 9/1992 | Hupe et al. |
| 5,203,798 A * | 4/1993 | Watanabe et al. ............ 134/184 |
| 5,628,926 A | 5/1997 | Belgacem et al. |
| 5,666,722 A | 9/1997 | Tamm et al. |
| 5,709,235 A * | 1/1998 | Akanuma et al. ............ 134/111 |
| 5,775,350 A * | 7/1998 | Akanuma et al. ............ 134/183 |

(Continued)

FOREIGN PATENT DOCUMENTS

EP 0 329 807 8/1989

(Continued)

OTHER PUBLICATIONS

Electronic translation of JP 10-224015.*

*Primary Examiner*—Joseph L. Perrin
(74) *Attorney, Agent, or Firm*—McDermott Will & Emery LLP

(57) ABSTRACT

It is possible to obtain a clean high-quality circuit board by removing affected material and foreign matter produced when a hole is formed. A manufacturing method of the circuit board includes (a) preparing a film-coated board material by bonding a film material as a mask to a board material, (b) forming a hole in the film-coated board material by applying a laser beam thereto, and (c) selectively removing the unnecessary material sticking to the film-coated board material from the film-coated board material by supersonic cleaning without peeling the film material off the board material. Unnecessary material such as foreign matter is produced when the hole is formed, and the unnecessary material sticks to the board material. After removal of such unnecessary material, a conductive material is disposed in the hole, using the film material as a mask, and the film material is later removed from the board material.

5 Claims, 8 Drawing Sheets

U.S. PATENT DOCUMENTS

| | | | |
|---|---|---|---|
| 5,836,325 A * | 11/1998 | Akanuma et al. | 134/183 |
| 5,840,402 A | 11/1998 | Roberts et al. | |
| 5,965,043 A | 10/1999 | Noddin et al. | |
| 6,058,950 A * | 5/2000 | Fujii et al. | 134/182 |
| 6,143,401 A | 11/2000 | Fischer et al. | |

FOREIGN PATENT DOCUMENTS

| | | |
|---|---|---|
| EP | 0 568 930 | 11/1993 |
| JP | 01078799 | 3/1989 |
| JP | 01214093 | 8/1989 |
| JP | 01258488 | 10/1989 |
| JP | 6-268345 A | 9/1994 |
| JP | 10224015 | 8/1998 |
| JP | 10-290072 | 10/1998 |

\* cited by examiner

METHOD OF MANUFACTURING A CIRCUIT BOARD AND ITS MANUFACTURING APPARATUS

This application is a divisional of application Ser. No. 09/736,499 filed Dec. 15, 2000 now U.S. Pat. No. 6,820,331.

FIELD OF THE INVENTION

The present invention relates to a method of manufacturing a circuit board and its manufacturing apparatus.

BACKGROUND OF THE INVENTION

With a recent trend of electronic equipment becoming more miniaturized and higher in component density, a circuit board to mount electronic components has evolved from a conventional single board to a double-sided board and a multilayer board. Accordingly, it is necessary to develop a higher density circuit board capable of integrating as many circuits as possible thereon.

For the manufacture of a high density circuit board, the employment of a laser beam machining method capable of high-speed fine machining is now studied in place of a conventional method of making a hole (through-hole) in a board by drilling that has been widely employed. Also, Japanese Laid-Open Patent No. 6-268345 discloses a method of drilling by a laser beam and a circuit forming board wherein layer connection is made by a means using a conductive paste.

In the technology of fine hole forming and layer connection by using a conductive paste, a slight amount of foreign matter can cause defective connection. In this technology, a board material coated with a film material is drilled. The film material is used as a mask to fill a conductive paste into fine holes. Accordingly, it is necessary to keep clean the entire board including the film material.

However, both of the drilling and laser beam machining methods cause generation of a large volume of chips. And there arises a problem such that the chips stick to the board material and clog the connecting hole (through-hole). Also, there is a fear that even a slight amount of dust in the air may cause clogging of the fine hole. The board material is cleaned before a conductive paste is filled into the hole. After using a film material as a mask for filling the conductive paste, the film material bonded to the board material is removed from the board material. Accordingly, the film material is very low in adhesion to the board material, and the film material is liable to come off the board material.

FIG. 8(a) shows a top plan view of a drilling portion in a conventional method of manufacturing a circuit forming board, and FIG. 8(b) shows a cross-sectional view of the drilling portion. As shown in FIGS. 8(a) and 8(b), polyethylene phthalate (PET) sheets 4a, 4b bonded to the portions of especially low in adhesion may sometimes peel off the board material 1. When such peeling takes place around a through-hole, conductive paste 31 for connection may spread into peeled portion 33 and, consequently, shorting 32 may take place between adjacent through-holes.

Accordingly, it is required to clean the board material without giving excessive stresses to the board material 1 and also without peeling the film materials 4a, 4b. However, it is very difficult to satisfy both of these requirements, resulting in insufficient cleaning of the board material.

As described above, the purpose of drilling the board material 1 is to connect the circuits formed on the surface and back or interlayer of the board with each other. After drilling, a connecting means is formed by metal-plating or conductive paste filling.

The sizes of holes and connecting means in a high density circuit board are very small and fine. Accordingly, even very fine foreign matter can cause serious influences to the reliability of connecting means. Therefore, it is necessary to completely remove such foreign matter. However, in a conventional method, film material 4a, 4b serving as a mask peels off when a great stress is given to the board material 1. And then the film material loses its function as a mask or a conductive paste spreads into the board material. Consequently, there arises a problem such as worsening of the reliability in insulation.

The present invention is intended to provide a method of manufacturing a low-cost highly reliable circuit board and its manufacturing apparatus, realizing a board material having high-quality fine holes.

SUMMARY OF THE INVENTION

A method of manufacturing a circuit board of the present invention comprises:

(a) a process for preparing a film-coated board material by bonding a film material to the surface of a board material, wherein the film material is bonded to at least either the surface or back of the board material;

(b) a process for forming a hole in the film-coated board material, wherein the hole has at least either a through-hole or a non-through-hole, unnecessary material is produced when the hole is formed and the unnecessary material sticks to the board material, and the unnecessary material has at least one selected from the group consisting of affected portion, affected material and foreign material which are generated from the board material; and (c) a process for selectively removing the unnecessary material sticking to the film-coated board material without peeling the film material off the board material.

Preferably, the method of manufacturing a circuit board, further comprises:

(d) a process for disposing a conductive material in the hole formed in the film-coated board material, using the film material as a mask; and (e) a process for removing the film material from the film-coated board material including the conductive material.

Further preferably, the hole forming process includes a step of forming a hole by applying a laser beam, and the application of the laser beam causes generation of the unnecessary material.

Preferably, the process for selectively removing the unnecessary material sticking to the film-coated board material from the film-coated board material includes a process for selectively removing the unnecessary material from the film-coated board material by vibrational energy generated from a supersonic oscillator while submerging the film-coated board material into a cleaning tank provided with a cleaning solution and the supersonic oscillator.

Further preferably, the process for selectively removing the unnecessary material sticking to the film-coated board material from the film-coated board material includes a process wherein a flow of the cleaning solution is generated between the supersonic oscillator and the film-coated board material, and the film-coated board material is subjected to supersonic cleaning while the liquid flow is applied to the board material.

Further preferably, the process for selectively removing the unnecessary material sticking to the film-coated board material from the film-coated board material includes a process wherein the film-coated board material is subjected to supersonic cleaning while a plate material is disposed between the supersonic oscillator and the film-coated board material, and the volume of supersonic energy reaching the film-coated board material is controlled by the plate material.

Further preferably, the process for selectively removing the unnecessary material sticking to the film-coated board material from the film-coated board material includes a process wherein the film-coated board material is subjected to supersonic cleaning while the film-coated board material is held between plate materials.

Further preferably, the process for selectively removing the unnecessary material sticking to the film-coated board material from the film-coated board material without peeling the film material off the board material includes (i) a cleaning process for selectively removing the unnecessary material from the film-coated board material while submerging the film-coated board material into a cleaning tank containing a cleaning solution, (ii) a process for taking the film-coated board material out of the cleaning tank after removing the unnecessary material, and (iii) a process for removing at least one of the remaining unnecessary material and cleaning solution sticking to the film-coated board material taken out of the cleaning tank, wherein the film-coated board material is heated in at least one of the process (i) and process (iii).

A cleaning device of the present invention serves to remove the unnecessary material from a film-coated board material to which unnecessary material is sticking. The film-coated board material comprises a board material and a film material as a mask bonded to the board material; the film material is bonded to the board material in a manner such that it can be peeled off the film-coated board material; the unnecessary material is produced when a hole is formed in the film-coated board material; and the unnecessary material is sticking to the film-coated board material.

The cleaning device comprises
a cleaning tank;
a cleaning solution provided in the cleaning tank;
a supersonic oscillator installed in the cleaning solution;
a feeding device which feeds the film-coated board material into th cleaning solution while retaining the film-coated board material; and
a selective removing means which selectively removes the unnecessary material from the film-coated board material without peeling the film material.

The selective removing means includes at least one selected from the group consisting of:

(i) a water flow generator which generates a water flow between the supersonic oscillator and the film-coated board material located above the supersonic oscillator;

(ii) a diffusing plate installed between the supersonic oscillator and the film-coated board material located above the supersonic oscillator; and (iii) resonance control plates which hold the film-coated board material therebetween.

Due to this configuration, it is possible to obtain a board material having clean and high-quality fine holes and also a low-cost highly reliable circuit board.

DESCRIPTION OF THE MARKS

Figure 1:
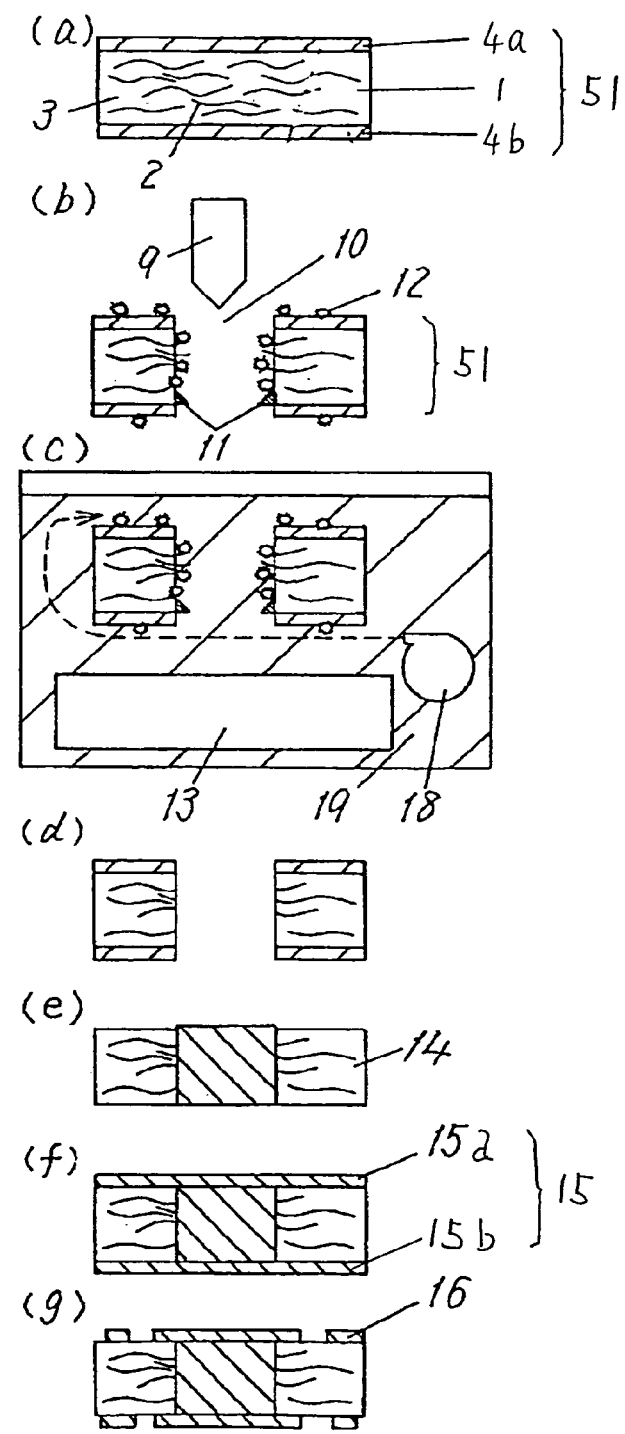
FIG. 1 is a cross-sectional view of a process for manufacturing a circuit board in the first embodiment of the present invention.

1 Board material
2 Aramide fiber
3 Epoxy resin
4a, 4b Film material (PET sheet)
9 Laser
10 Through-hole
11 Affected portion
12 Chips
13 Supersonic oscillator
14 Conductive paste
15 Metallic foil
16 Circuit pattern
17 Diffusing plate
18 Pump
19 Cleaning solution
20 Resonance control plate
21 Resonance control plate also serving as a carrying plate
22 Feeding device
23 Removing device
30 Cleaning tank
32 Upper belt conveyor
34 Lower belt conveyor
51 Film-coated board material

DETAILED DESCRIPTION OF THE INVENTION

A method of manufacturing a circuit board of the present invention comprises:

(a) a process for preparing a film-coated board material by bonding a film material to the surface of a board material, wherein the film material is bonded to at least either the surface or back of the board material;

(b) a process for forming a hole in the film-coated board material, wherein the hole has at least either a through-hole or a non-through-hole, unnecessary material is produced when the hole is formed and the unnecessary material sticks to the board material, and the unnecessary material includes at least one selected from the group consisting of affected portion, affected material and foreign material which are generated from the board material; and (c) a process for selectively removing the unnecessary material sticking to the film-coated board material without peeling the film material off the board material.

Preferably, the method of manufacturing a circuit board, further comprises:

(d) a process for disposing a conductive material in the hole formed in the film-coated board material, using the film material as a mask; and (e) a process for peeling the film material off the film-coated board material having the conductive material.

Further preferably, the hole forming process includes a step of forming a hole by applying a laser beam, and the application of the laser beam causes generation of the unnecessary material. The unnecessary material includes at least one selected from the group consisting of affected portion, affected material and foreign matter.

The affected portion is formed on the surface of the board material and on the inner wall of the hole during the hole forming process.

The affected material, after becoming freed from the board material during or after the process, includes powder or lump material sticking again to the board material.

In this way, the desired through-hole or non-through-hole is formed, and furthermore, a clean board material can be obtained.

It is possible to realize clean and high-quality hole forming by this manufacturing method, and in addition, to obtain a low-cost highly reliable circuit board.

Further, even when a hole is formed by laser bean machining, a circuit board being excellent in accuracy and cleanness can be obtained without losing the high-speed characteristics of laser beam machining.

Preferably, the process for removing the unnecessary material from the film-coated board material includes a process for selectively removing the unnecessary material by supersonic cleaning of the film-coated board material having the unnecessary material. The supersonic cleaning is performed in a water tank provided with a cleaning solution and a supersonic oscillator.

Further preferably, the process for removing the unnecessary material from the film-coated board material includes a blowing process for removing the unnecessary material or water by blowing a gas to the film-coated board material.

Further preferably, the process for removing the unnecessary material from the film-coated board material includes a process for driving the supersonic oscillator while generating a flow of the cleaning solution located between the supersonic oscillator and the film-coated board material and applying the liquid flow to the board material.

In this way, the sound field of vibration will be diffused. Moreover, the cavitation generated due to the supersonic oscillator is diffused. Accordingly, the vibrational energy can be controlled. In addition, the damage given to the film-coated board material due to the cavitation will be suppressed. Therefore, the unnecessary material may be selectively removed from the film-coated board material without peeling the film material off the board material. Consequently, it is possible to obtain a desired clean hole and also to clean the film-coated board material.

Preferably, the process for removing the unnecessary material from the film-coated board material includes a process of cleaning by a supersonic oscillator while disposing a plate material between the supersonic oscillator and the film-coated board material. In this way, the vibrational energy given to the film-coated board material can be controlled. By controlling the vibrational energy and the sound field of vibration, it is possible to selectively remove the affected material, powder or lump, from the board material without peeling the film material off the film-coated board material. As a result, it is possible to obtain a through-hole or non-through-hole and also to obtain a clean film-coated board material.

Preferably, the process for removing the unnecessary material from the board material includes a process of cleaning by a supersonic oscillator while holding on both sides the film-coated board material by plate materials. Or, the process for removing the unnecessary material from the board material includes a process of cleaning by a supersonic oscillator while a plate material is bonded to one side of the film-coated board material. Thus, the resonance of the film-coated board material is controlled, thereby preventing the film material from peeling off the portion where its adhesion to the board material is low, and also the affected material may be selectively removed from the film-coated board material. As a result, it is possible to form a desired through-hole or non-through-hole and further to clean the board material surface.

Preferably, the process for generating a flow of the cleaning solution includes a step of controlling the flow rate, volume and direction of the solution by using a pump.

Preferably, the discharge device to generate a flow of the cleaning solution includes a slit type discharge port. Thus, it is possible to generate a liquid flow over the whole effective width of the supersonic oscillator without giving shocks to the film-coated board material to be cleaned.

Preferably, the discharge device includes a shower type discharge port. Thus, it is possible to easily increase the water pressure, and as a result, to generate a liquid flow that can reach the overall length of the oscillator even in case of installing multiple oscillators.

Preferably, the discharge devices are installed at a plurality of positions. Thus, it is possible to generate a liquid flow effectively at necessary portions.

Preferably, there is provided a flat plate between the supersonic oscillator and film-coated board material. Further preferably, a plurality of flat plates are disposed and the number of the flat plates is controlled. Thus, it is possible to control the energy of the supersonic oscillator.

Preferably, there is provided a corrugated plate between the supersonic oscillator and film-coated board material. Thus, it is possible to diffuse the energy of the supersonic oscillator over a wide range.

Preferably, at least one hole having a diameter less in wavelength than $1/4$ of a standing wave is disposed between the supersonic oscillator and film-coated board material. Thus, it is possible to reduce the influence of cavitation and to effectively obtain the impulse wave by the supersonic oscillator.

Preferably, a metallic plate is disposed between the supersonic oscillator and film-coated board material. Thus, it is possible to reduce the influence of erosion and, as a result, to prolong the life of the apparatus.

Preferably, a plurality of thin plates are disposed between the supersonic oscillator and film-coated board material. Thus, it is possible to easily control the sound pressure.

Preferably, there are provided plates internally having an air layer or air bubbles and the plates hold the board material therebetween. Thus, it is possible to control the resonance of the board material.

Preferably, the process for removing the unnecessary material includes a step of moistening the film-coated board material with a cleaning solution before holding the film-coated board material with the plates. Thus, the film-coated board material is tightly linked to the plate. Accordingly, it is possible to remarkably control the resonance. Further, the cleaning solution getting into the hole effectively acts to clean the hole.

Preferably, the supersonic oscillator has a sound pressure of $9.55 \times 10^{10}$ µPa or over, and a plate is disposed between the film-coated board material and supersonic oscillator. Thus, it is possible to control the sound pressure and to make the condition suitable for obtaining a good hole shape.

Preferably, the supersonic oscillator has a sound pressure ranging from $4.78 \times 10^{10}$ µPa to $9.55 \times 10^{10}$ µPa, and a plate is disposed between the film-coated board material and supersonic oscillator. Thus, it is possible to obtain a good hole shape without peeling the film material off the film-coated board material.

Preferably, the process for removing the unnecessary material from the film-coated board material includes a process of cleaning the film-coated board material in a tank containing a liquid and a blowing process to remove unnecessary material or water sticking to the film-coated board material by blowing a gas thereto. Or, the process for removing the unnecessary material from the film-coated board material includes a process of cleaning the film-coated board material in a tank containing a liquid, and a mechanical cleaning process to remove unnecessary material sticking to the film-coated board material by means of a rotary brush or the like. At least one of the cleaning process, blowing process and mechanical cleaning process includes a process of heating the film-coated board material by using a heating means. By adding a process to heat the film-coated board material, it is possible to prevent the film material from peeling of f the film-coated board material in the process.

Preferably, the process for removing the unnecessary material from the film-coated board material includes a process of preheating the film-coated board material before the cleaning process or blowing process or mechanical cleaning process by using a preheating means to heat the film-coated board material. Thus, the adhesion strength between film material and board material will be increased before a stress is applied in each process. As a result, it is possible to prevent the film material from peeling off the film-coated board material.

Preferably, the film used for the film-coated board material has a thermosetting resin layer disposed on the surface to be bonded to the board material.

Preferably, the liquid used in the cleaning process is heated. Thus, it is possible to prevent the film material from peeling off the film-coated board material during cleaning.

Preferably, the gas used in the blowing process is heated. Thus, the adhesion strength of the film-coated board material will be increased. As a result, peeling of the film material due to air pressures can be prevented.

Preferably, the adhesion strength between the board material and film material after the bonding process is physically in proportion to the temperatures. The temperature of heating the film-coated board material to be heated by a heating means ranges from the first temperature to the second temperature with respect to the film material. The first temperature is the temperature at which the film material does not peel off the board material due to the mechanical stress or physical stress applied to the film-coated board material in the cleaning process including carrying operation or in the blowing process, that is the temperature at which the adhesion strength equivalent to the peeling boundary is obtainable. The second temperature is the heat resisting temperature of board material or the heat resisting temperature of film material or the critical temperature that invites the desired physical property change. Thus, it is possible to obtain a circuit forming board having excellent performance without affecting the physical properties of board material and film material.

Preferably, the board material includes prepreg of B stage that is a thermosetting resin impregnated reinforcement. Thus, it is possible to minimize the influence of water against the board material of which the thermosetting resin includes non-hardened components.

Preferably, the reinforcement includes glass fiber woven cloth or non-woven cloth. Thus, it is possible to reduce the unevenness of inner walls of the hole due to the difference in machining rate between thermosetting fiber and reinforcement.

Preferably, the reinforcement includes woven or non-woven cloth made up of aromatic polyamide fiber. The woven or non-woven cloth made up of aromatic polyamide fiber has excellent workability in laser beam machining, making it easier to make a hole. Further, it is possible to perform effective cleaning even when the thermosetting epoxy resin melted by the heat during laser beam machining remains in the through-hole as chips having tackiness.

Preferably, the liquid is water or refined pure water. Thus, the running cost in the manufacturing process is lowered because the water is inexpensive. Further, the evaporated water is harmless to human body, requiring no liquid recovering device, and the cost of the manufacturing apparatus will be lowered.

Preferably, the liquid is an organic solvent. By using an organic solvent having a desirable boiling point, it is possible to facilitate the board material drying process after the process of removing unnecessary material.

Preferably, the circuit board manufacturing method further comprises a process of forming a connecting means which connects the surface circuits formed on the surface of the circuit forming board or the internal circuits formed therein to each other in the through-hole or non-through-hole. Thus, it is possible to obtain a multilayer circuit board.

Further preferably, the process for forming the connecting means includes a process to fill a paste containing conductive particles in the hole formed in the board material. Thus, the inner walls of the hole are less in unevenness and there is no chips sticking to the hole so that the paste may be reliably filled into the hole.

Preferably, the process for forming the connecting means includes a process of plating the hole. Since the inner walls of the hole are less in unevenness and there is no sticking of chips, the-metal-plating performance will be improved.

Preferably, the method of manufacturing a circuit board further comprises a process of carrying the film-coated board material onto a supersonic oscillator while holding the board material on both sides by plate material. Preferably, the plate material is larger in area than the supersonic oscillator and board material. Thus, it is possible to control the resonance of the film-coated board material and to continuously clean the film-coated board material.

In the process of holding the film-coated board material on both sides by the plate material, the plate material is larger in area than the board material. Thus, it is possible to precisely control the resonance of the board material.

A circuit board manufacturing apparatus in accordance with one embodiment of the present invention comprises the apparatus mentioned in the above description of the manufacturing method.

A cleaning device of the present invention serves to remove the unnecessary material sticking to the film-coated board material. The film-coated board material includes a board material and also a film material as a mask bonded to the board material, and the film material is bonded to the board material in a manner such that it can be peeled off the film-coated board material, and the unnecessary material is produced when a hole is formed in the film-coated board material, and the unnecessary material is sticking to the film-coated board material.

The cleaning device comprises
a cleaning tank;
a cleaning solution provided in the cleaning tank;
a supersonic oscillator installed in the cleaning solution;
a feeding device which feeds the film-coated board material into the cleaning solution while retaining the film-coated board material; and
a selective removing means which selectively removes the unnecessary material from the film-coated board material without peeling the film material.

The selective removing means includes at least one selected from the group consisting of
(i) a water flow generator which generates a water flow between the supersonic oscillator and the film-coated board material located above the supersonic oscillator;
(ii) a diffusing plate installed between the supersonic oscillator and the film-coated board material located above the supersonic oscillator; and
(iii) resonance control plates which hold the film-coated board material therebetween.

Due to this configuration, it is possible to obtain a board material having clean and high-quality fine holes and also a low-cost highly reliable circuit board.

Preferably, the film-coated board material retained by the feeding device passes over the supersonic oscillator at a predetermined distance therefrom;
the selective removing means has the resonance control plates which hold the film-coated board material therebetween, and the carrying means also serves as the resonance control plate; and the resonance control plate functions to control the supersonic energy generated by the supersonic oscillator.

Further preferably, the resonance control plate has an area at least equivalent to that of the board material.

Further preferably, the feeding device includes upper and lower conveyors;
the upper conveyor includes a first plurality of resonance control plates;
the lower conveyor includes a second plurality of resonance control plates;
each of the first plurality of resonance control plates and each of the second plurality of resonance control plates pass over the supersonic element while holding the film-coated board material therebetween.

Further preferably, the selective removing means has the water flow generator which generates a water flow between the supersonic oscillator and the film-coated board material located above the supersonic oscillator, and
the water flow generator includes a submergible pump.

The water flow has a function to precisely diffuse the sound field stagnating near the film-coated board material. Also, it functions to diffuse the cavitation generated by the supersonic oscillator so that it will not reach the film-coated board material.

Exemplary embodiments of the present invention will be described in the following with reference to the drawings.

Exemplary Embodiment 1

FIG. 1 is a cross-sectional view of a process in the manufacture of a circuit board in one embodiment of the present invention, showing a multilayer circuit board manufacturing process. In FIG. 1(a), board material 1 has a shape of 250 nm sq. and about 150 µm thick, which functions as an insulating material. The board material 1 includes, for example, resin impregnated material wherein non-woven cloth made up of aromatic polyamide fiber 2 (hereinafter called aramide fiber) that serves as reinforcement is impregnated with thermosetting epoxy resin 3 (hereinafter called epoxy resin). The epoxy resin 3 is not completely thermosetting, containing some non-hardened component. That is, the resin impregnated material includes a state of B stage. Accordingly, the board material 1 is usually called prepreg.

Film materials 4a, 4b are about 10 µm in thickness. A release layer having thermosetting epoxy resin or silicone compound as release agent is applied to one side of the film material, and the film materials 4a, 4b can be peeled off the board material. It is preferable to use thermosetting epoxy resin as release agent. As film materials 4a, 4b, resin material is used, for example, polyethylene phthalate (hereinafter called PET sheet) is employed. The film materials 4a, 4b are used as mask film, peeled and discarded after using in the later process. Accordingly, the film materials 4a, 4b are bonded to the board material 1 in low adhesion strength. The adhesion strength between the film materials 4a, 4b and the board material 1 is, for example, about 1 g/cm width in peeling strength. In this way, film-coated board material 51 is formed with film materials 4a, 4b bonded thereto.

As shown in FIG. 1(b), laser 9 is applied to board material 1 with film materials 4a, 4b bonded thereto in order to form through-hole 10 in the film material and board. At that time, most part of the thermosetting epoxy resin and aramide fiber contained in the board material 1 is sublimated by heat and dispersed in all directions. However, a part of the thermosetting epoxy resin and aramide fiber is not completely sublimated and remains as affected portion 11 on the wall surfaces of hole 10. The affected portion 11 is hard and fragile. Also, the aramide fiber has relatively high heat resistance as compared with thermosetting epoxy resin. The aramide fiber is low in machining rate by laser. Therefore, the aramide fiber is not completely sublimated and remains in the hole. The inner walls of hole 10 have uneven surfaces as shown. On the other hand, a part of the thermosetting epoxy resin and aramide fiber dispersed in all directions becomes chips 12 as affected material, and the chips 12 stick to the surface of board material 1 or to the inside of through-hole 10. The affected portion 11 and affected material 12 are unnecessary for the board material.

As shown in FIG. 1(c), the film-coated board material 51 having the hole 10 therein is immersed in a water tank in which cleaning solution 19 and supersonic oscillator 13 are disposed. The temperature of the cleaning solution 19 is kept at 60° C. A flow of the cleaning solution is created by pump 18. Also, the supersonic oscillator 13 is operated. In this condition, the film-coated board material 51 is brought close to the supersonic oscillator 13. Preferably, the discharge port of pump 18 is located between the film-coated board material 51 and the supersonic oscillator 13. The flow of cleaning solution is preferred to be positioned between the film-coated board material 51 and the supersonic oscillator 13. Thus, the film-coated board material 51 is vibrated by the supersonic energy applied from the supersonic oscillator 13. And, the affected portion 11 and chips 12 are peeled and removed from the board material 1. In this way, unnecessary material such as affected portion 11 and chips 12 will be removed from the film-coated board material 51.

Thus, as shown in FIG. 1(d), a film-coated board material 51 having a good hole shape may be obtained.

Figure 2:
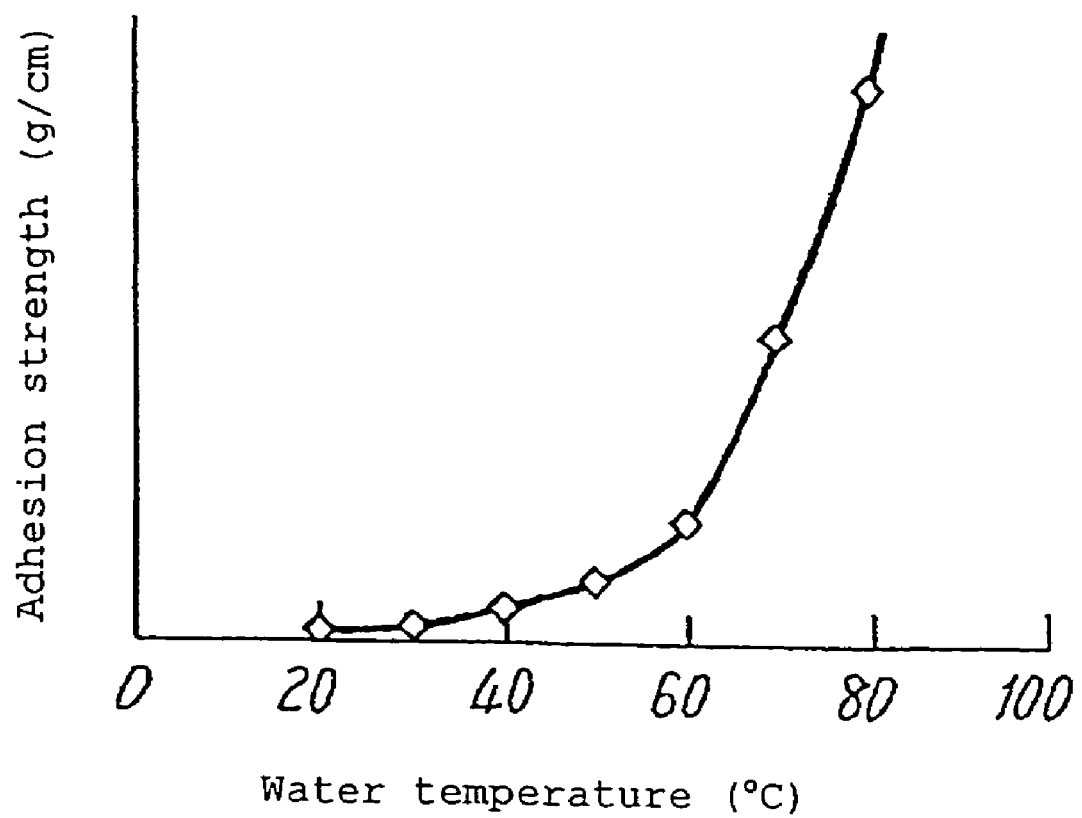
FIG. 2 is a characteristic graph showing the relationship between adhesion strength and water temperatures in the first embodiment of the present invention.

FIG. 2 shows the relationship between film material 4a, 4b and board material 1 with respect to the adhesion strength and temperatures in the present embodiment. In the process of removing the unnecessary material, thermosetting epoxy resin in a state of B stage is employed, and therefore, it is preferable to add heat in such a range that the epoxy contained will not harden. Thus, it is possible to remarkably increase the adhesion between film material 4a, 4b and board material 1 and to improve the peeling strength of the film-coated board material 51.

Also, since a flow of the cleaning solution is created between the film-coated board material 51 and the supersonic oscillator 13, stagnation of cavitation that may cause the film material to peel off the board material can be prevented. Cavitation is fine air bubbles produced near the supersonic oscillator due to the operation of the supersonic oscillator. Moreover, the sound pressure is diffused due to the flow of cleaning solution, and the vibrational energy will be controlled. Accordingly, the film material subjected to cavitation and sound pressures is prevented from peeling off the board material, and at the same time, unnecessary material such as affected portion 11 and chips 12 is selectively removed from the film-coated board material 51.

Also, it is possible to employ a configuration that uses a plurality of supersonic oscillators. In this case, it is preferable that the discharge ports of the cleaning solution be equal in number to the plurality of supersonic oscillators. Thus, the flow weakens in strength, and the effect to prevent the film material from peeling off the board material will be improved.

On the other hand, as a process for removing unnecessary material, a removing process as shown in FIG. 1(c) is also effective.

Preferably, the sound pressure oscillated from the supersonic oscillator 13 is $9.55 \times 10^{10}$ μPa or over.

Figure 3:
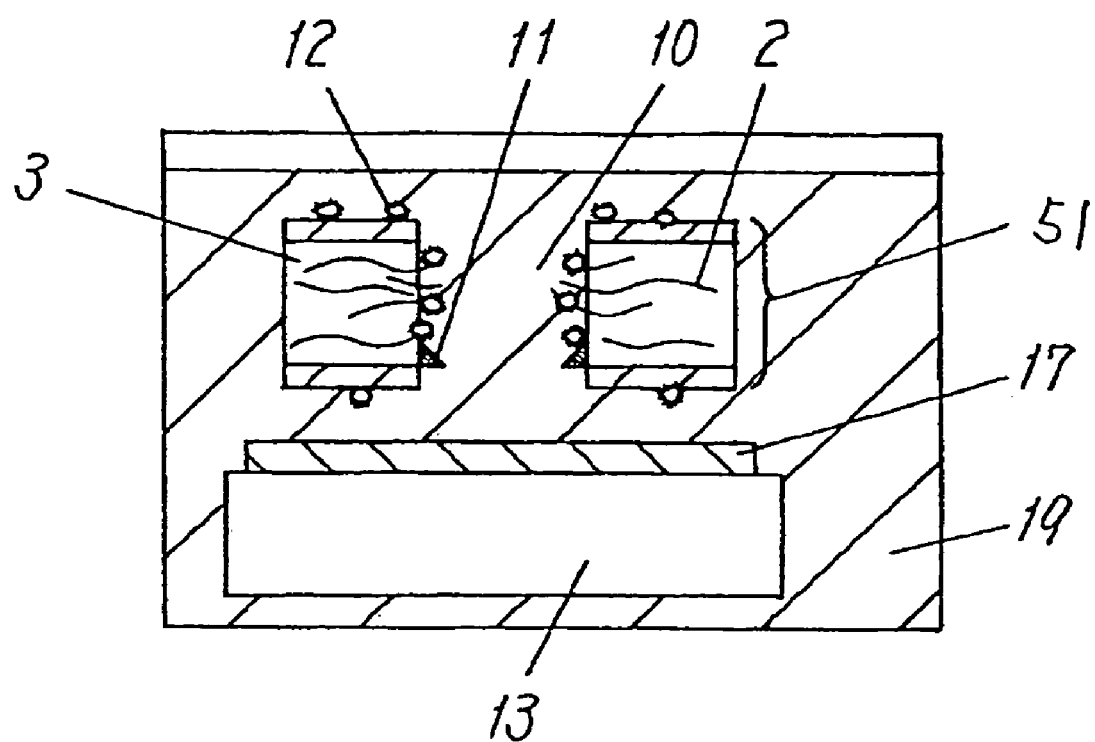
FIG. 3 is a cross-sectional view of an outline process for manufacturing a circuit board in place of FIG. (c).

FIG. 3 shows another process for removing unnecessary material in accordance with the present embodiment. In FIG. 3, a diffusing plate 17 is disposed between supersonic oscillator 13 and film-coated board material 51. In this case, the sound pressure oscillated from the supersonic oscillator 13 is controlled in a range from $4.78 \times 10^{10}$ μPa to $9.55 \times 10^{10}$ μPa. Thus, it is possible to prevent the film material 4a, 4b from peeling off the board material 1, and to selectively remove the unnecessary material such as hard and fragile affected portion 11 and chips 12.

Figure 4:
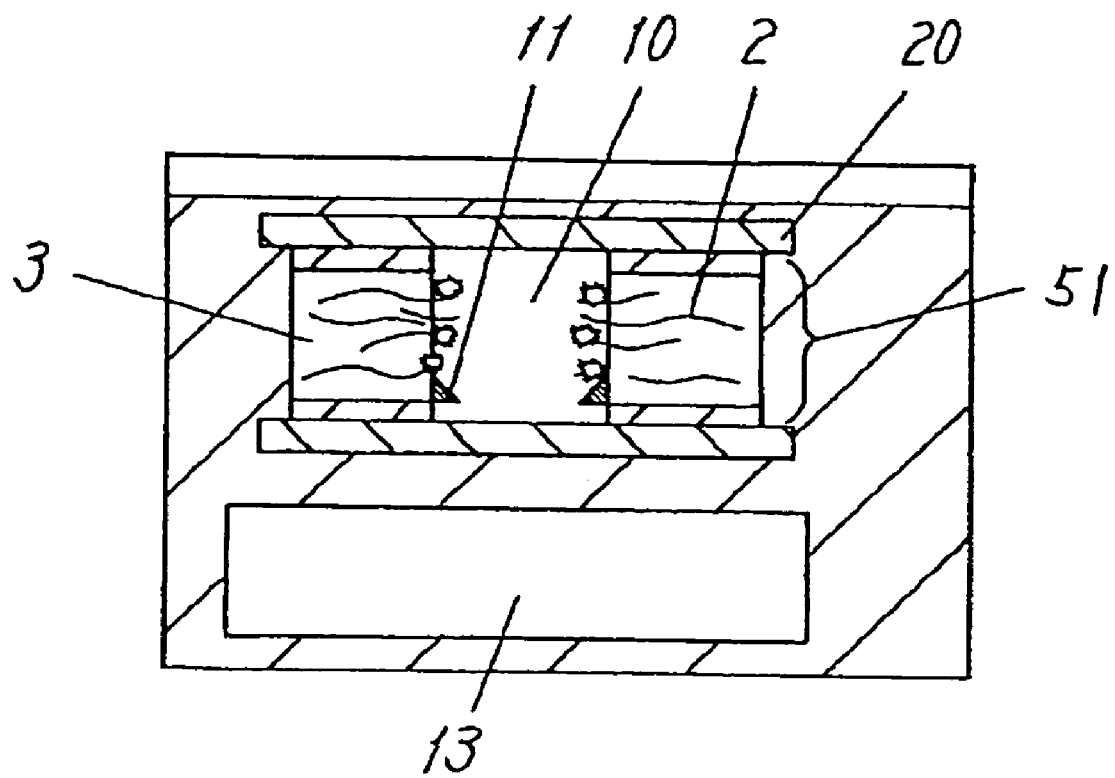
FIG. 4 is a cross-sectional view of an outline process for manufacturing a circuit board in place of FIG. (c).

FIG. 4 shows further another process for removing unnecessary material in accordance with the present embodiment. In FIG. 4, film-coated board material 51 is moistened with a cleaning solution in advance. After that, the moistened film-coated board material 51 is held on both sides by resonance control plate 20. The film-coated board material 51 held by the resonance control plate 20 is brought close to the supersonic oscillator in the cleaning solution. In this way, supersonic cleaning is performed.

The film-coated board material 51 is, for example, moistened by a shower of cleaning solution. Since the film-coated board material 51 is held on both sides by resonance control plate 20, the board material 1 and film material 4a, 4b become rigid, thereby controlling the resonance of the portion being less in adhesion strength between the board material 1 and the film material 4a, 4b. Accordingly, it is possible to prevent the film material 4a, 4b from coming loose from the board material 1. At, that time, through-hole 10 is filled up with the cleaning solution previously used for moistening purpose. Thus, the supersonic waves reaches the interior of the hole to selectively and efficiently remove the unnecessary material such as hard and fragile affected portion 11 and chips 12.

Next, as shown in FIG. 1(e), a conductive paste 14 as conductive material is filled into through-hole 10 by means of printing or the like. In this case, the film material functions as a mask. Since the through-hole 10 has a good shape, the conductive paste 14 is smoothly and completely filled into the through-hole 10. After the conductive paste 14 is filled into the through-hole 10, the film materials 4a, 4b as mask film are peeled off the board material 1.

Next, as shown in FIG. 1(f), the board material 1 having the conductive paste 14 is held on both sides by metallic foils 15, that is, upper metallic foil 15a and lower metallic foil 15b. After that, the board material 1 and metallic foils 15 are heated and pressed by a hot press (not shown). Thus, board material 1 having conductive paste 14 is formed and, at the same time, the upper metallic foil 15a and lower metallic foil 15b are electrically connected to each other by the conductive paste 14. Subsequently, at least one of the upper metallic foil 15a and lower metallic foil 15b is subjected to patterning into a desired-shape. In this way, a circuit pattern 16 is formed as shown in FIG. 1(g). FIG. 1(g) shows a double-sided circuit board having a circuit pattern on both sides of the board material 1.

Thus, a cleaning device of the present embodiment removes the unnecessary material from a film-coated board material to which unnecessary material is sticking. The film-coated board material includes a board material and a film material as a mask bonded to the board material; the film material is bonded to the board material in a manner such that it can be peeled off the film-coated board material; the unnecessary material is produced when a hole is formed in the film-coated board material; and the unnecessary material is sticking to the film-coated board material.

The cleaning device comprises
a cleaning tank;
a cleaning solution provided in the cleaning tank;
a supersonic oscillator installed in the cleaning solution;
a feeding device which feeds the film-coated board material into the cleaning solution while retaining the film-coated board material; and
a selective removing means which selectively removes the unnecessary material from the film-coated board material without peeling the film material.

The selective removing means includes at least one selected from the group consisting of
(i) a water flow generator which generates a water flow between the supersonic oscillator and the film-coated board material located above the supersonic oscillator;
(ii) a diffusing plate installed between the supersonic oscillator and the film-coated board material located above the supersonic oscillator; and
(iii) resonance control plates which hold the film-coated board material therebetween.

Preferably, the film-coated board material retained by the feeding device passes over the supersonic oscillator at a predetermined distance therefrom;
the selective removing means has the resonance control plates which hold the film-coated board material therebetween, and the carrying means also serves as the resonance control plate.

The resonance control plate functions to control the supersonic energy generated by the supersonic oscillator.

Preferably, the resonance control plate has an area at least equivalent to that of the board material.

Preferably, the resonance control plate includes a plate which internally has at least either an air layer or bubbles.

Preferably, the selective removing means includes a diffusing plate disposed between the supersonic oscillator and the film-coated board material located above the supersonic oscillator, and the diffusing plate has a function to control the sound pressure generated by the supersonic oscillator.

Preferably, the diffusing plate includes at least one selected from the group consisting of a flat plate, corrugated plate and metal plate.

Preferably, the diffusing plate includes a plurality of thin plates.

Preferably, the manufacturing apparatus further comprises another removing device to remove at least one of the remaining unnecessary material and cleaning solution sticking to the film-coated board material taken out of the cleaning tank.

The another removing device includes at least one of
(a) a blowing device which removes the remaining unnecessary material and cleaning solution sticking to the film-coated board material by blowing a gas thereto; and
(b) a mechanical cleaning device which uses a rotary brush.

Preferably, water or pure water is used as a cleaning solution.

Although the description of the present embodiment has referred to a double-sided circuit board, it is also possible to obtain a multilayer circuit board by repeating the above process a plurality of times. That is, a multilayer circuit board can be obtained by laminating board material having a plurality of metallic foil circuit patterns.

In this way, it is possible to easily form a highly accurate hole in a board material to which film material is bonded as a mask. Further, foreign matter or unnecessary material can be selectively and precisely removed without peeling the film material off the board material. Accordingly, conductive material is accurately formed in the hole, using the film material as a mask. As a result, a highly reliable circuit board can be obtained at a low cost. Particularly, a highly accurate hole can be obtained at a high speed by applying a laser beam. Moreover, affected portion and foreign matter generated due to laser beam application can be easily removed. Accordingly, it is possible to obtain a circuit board having properties of both high-speed workability and high quality.

Exemplary Embodiment 2

Figure 5:
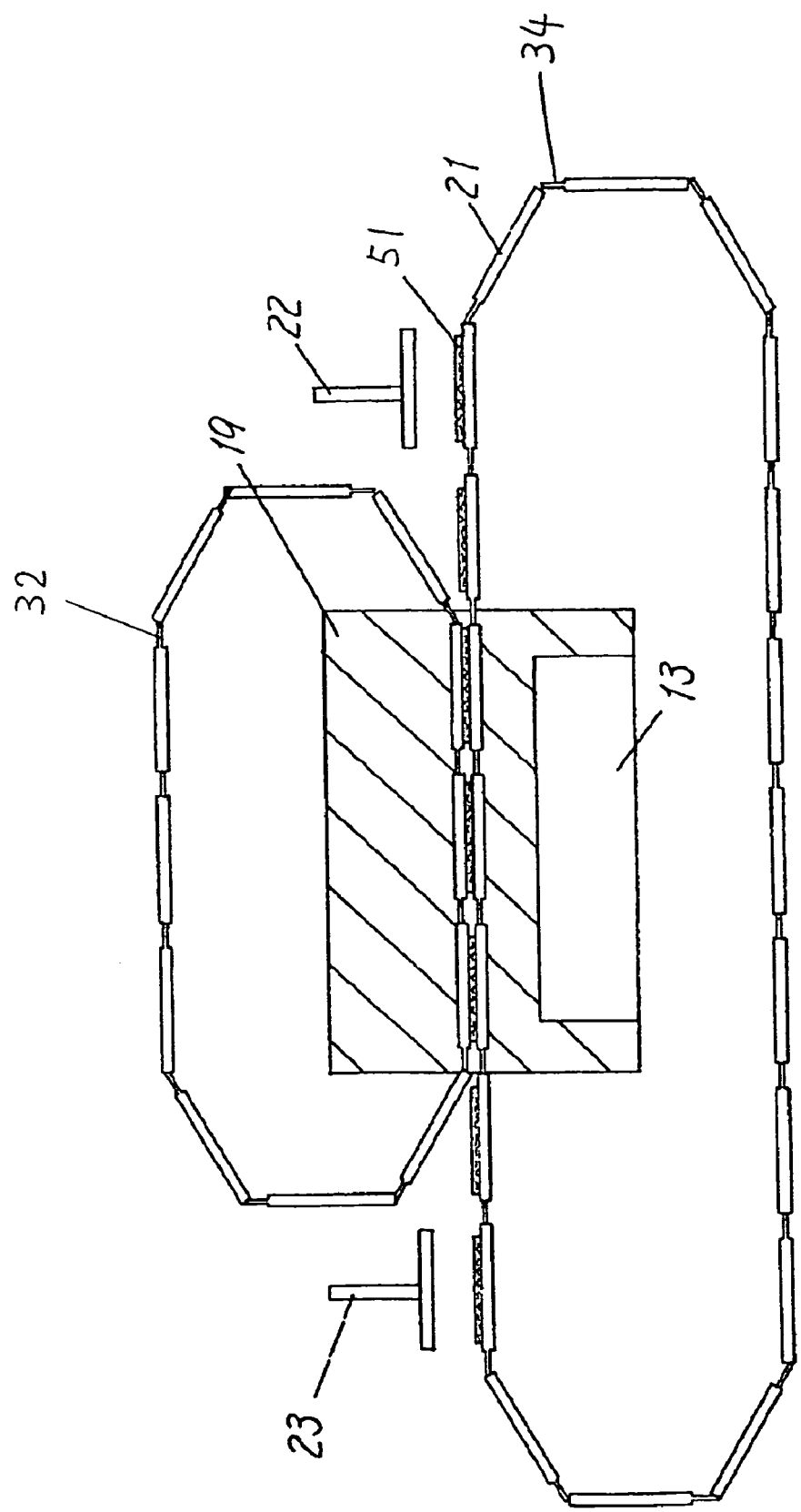
FIG. 5 is a outline cross-sectional view of a circuit board manufacturing apparatus in the second embodiment of the present invention.

FIG. 5 is an explanatory diagram of a circuit board manufacturing apparatus in one embodiment of the present invention. In FIG. 5, resonance control plates 21 also serving as carrying plates include the functions of belt conveyors 32, 34. A plurality of resonance control plates 21 move in a continuous manner. The belt conveyors including a plurality of resonance control plates 21 comprise upper belt conveyor 32 and lower belt conveyor 34. Cleaning solution 19 and supersonic oscillator 13 are disposed in a cleaning tank 30. Film-coated board material 51 is placed on the lower belt conveyor 34 in order by means of a feeding device 22. The belt conveyor 34 with the film-coated board material 51 placed thereon moves into the supersonic cleaning tank. At that time, the resonance control plates 21 of the upper belt conveyor 32 move while holding the film-coated board material 51 therebetween which are placed on the lower belt conveyor 34. In this condition, the supersonic oscillator 13 is operated. Thus, unnecessary material remaining on the film-coated board material 51 is removed by supersonic waves. In this way, the resonance control plates 21 holding the film-coated board material 51 therebetween move in the cleaning tank. After removing the unnecessary material from the board material, the film-coated board material 51 is taken out by a removing device 23.

Thus, the unnecessary material is automatically and continuously removed from the film-coated board material 51. Accordingly, it is possible to obtain a circuit board manufacturing apparatus having excellent efficiency.

Exemplary Embodiment 3

Figure 6:
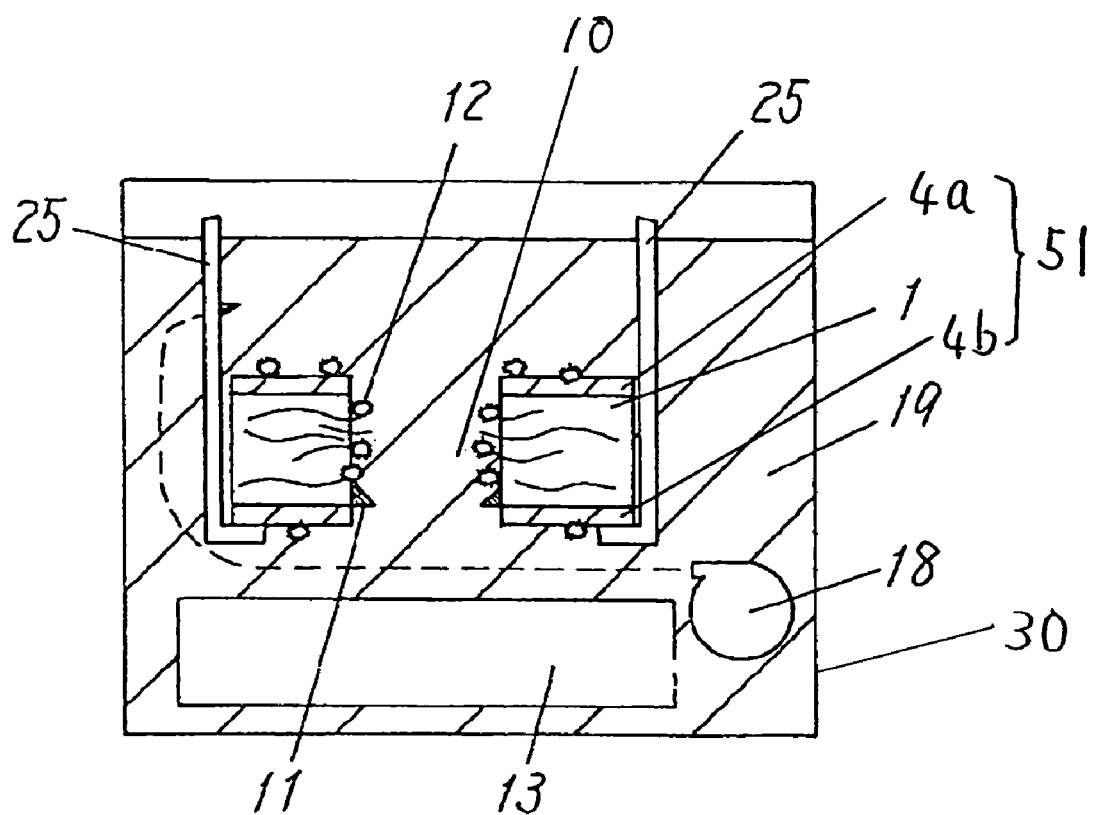
FIG. 6 is a outline cross-sectional view of a circuit board manufacturing apparatus in the third embodiment of the present invention.

FIG. 6 shows a circuit board manufacturing apparatus in accordance with another embodiment. In FIG. 6, cleaning solution 19, supersonic oscillator 13 and water flow generator 18 are disposed in a cleaning tank 30. A submergible pump 18 as a water flow generator is installed in the cleaning solution 19. The submergible pump 18 serves to generate a flow of cleaning solution. A carrying device 25 with film-coated board material 51 placed thereon is carried into the cleaning solution 19 and moves in the cleaning solution 19. The film-coated board material 51 includes board material 1, film materials 4a, 4b, affected portion 11 and chips 12. Unnecessary material such as affected portion 11 and chips 12 is generated when through-hole 10 is formed, and the unnecessary material is hard and fragile. The discharge port of submergible pump 18 is located so that the cleaning solution flows between supersonic oscillator 13 and film-coated board material 51. In this configuration, cavitation is generated near the supersonic oscillator. The cavitation is diffused along the flow of the cleaning solution. Or, the vibrational energy generated by the supersonic oscillator is diffused. Accordingly, it is possible to prevent the cavitation from acting on the film-coated board material 51. Or, the vibrational energy is controlled. Accordingly, it is possible to prevent film materials 4a, 4b from peeling off the board material 1 due to the cavitation or vibrational energy. On the other hand, the vibrational energy generated by the supersonic oscillator serves to selectively remove the affected portion 11 and chips 12 from the film-coated board. Therefore, it is possible to remove unnecessary material while preventing the film materials 4a, 4b from peeling off the board material 1. Consequently, a high-quality circuit board can be obtained.

Preferably, the submergible pump 18 has at least either a slit type discharge port or shower type discharge port, and the discharge port serves to generate the water flow in the direction between the supersonic oscillator and the film-coated board material.

Preferably, the water flow generator has several discharge ports disposed in the cleaning tank, and each discharge port serves to generate the water flow in the predetermined direction.

Exemplary Embodiment 4

Figure 7:
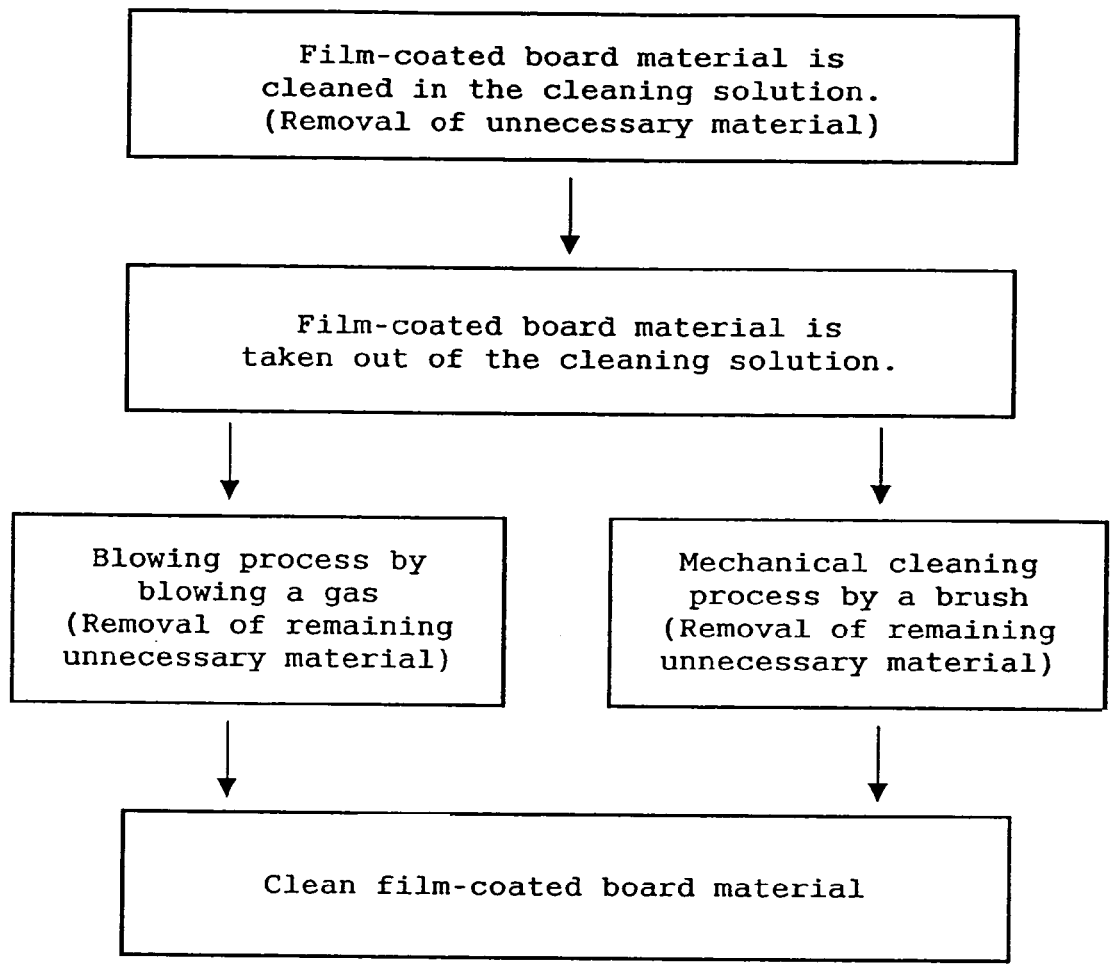
FIG. 7 is a flow chart of a circuit board manufacturing process in the fourth embodiment of the present invention.
Figure 8:
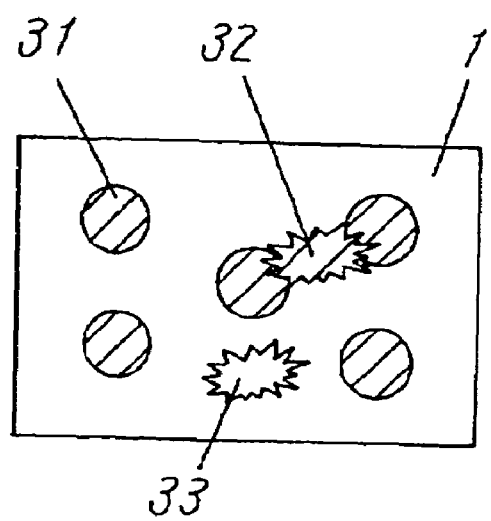
FIG. 8(a) is a plan view of a drilling portion in a conventional circuit board manufacturing method.
FIG. 8(b) is a cross-sectional view of the drilling portion.
Figure 8:
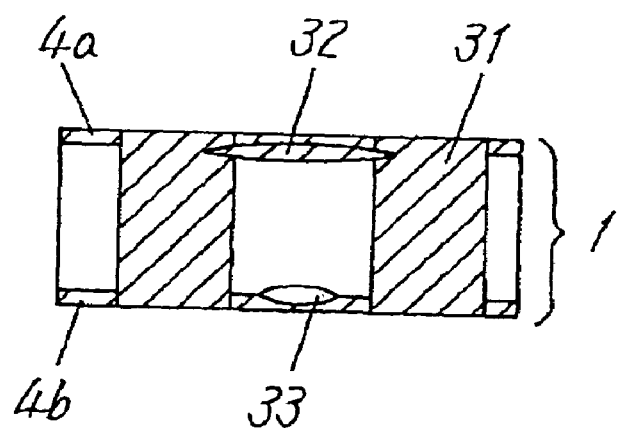

FIG. 7 shows a circuit board manufacturing apparatus in accordance with another embodiment. In FIG. 7, cleaning solution 19 is disposed in cleaning tank 30. Film-coated board material 51 is carried into the cleaning solution 19 and then moves in the cleaning solution 19. The film-coated board material 51 includes board material 1, film materials 4a, 4b, affected portion 11 and chips 12. Unnecessary material such as affected portion 11 and chips 12 is produced when a through-hole 10 is formed, and the unnecessary material is hard and fragile. The unnecessary material is removed while the film-coated board material 51 moves in the cleaning solution. Next, the film-coated board material is taken out of the cleaning solution by a removing device. After that, a gas is applied to the film-coated board material then removed. The gas used is air or nitrogen. By the gas blowing process, unnecessary material such as affected material and foreign matter remaining on the film-coated board material is blown off and removed. Further, cleaning solution sticking to the film-coated board material is also removed. Or, a mechanical cleaning device such as a rotary brush serves to remove unnecessary material remaining on the film-coated board material. In this way, affected material and foreign matter produced when a hole is formed is removed from the film-coated board material. As a cleaning solution, it is preferable to use organic solvents. Also, it is preferable to heat the film-coated board material at a temperature higher than normal temperature before the blowing process or mechanical cleaning process. Preferably, in particular, the heating temperature ranges from the temperature at which the film material is not peeled due to stresses to the heat resisting temperature and the desired temperature of the board material and film material.

Exemplary Embodiment 5

In the circuit board manufacturing method and apparatus of the above exemplary embodiments 1, 2 and 3, it is also possible to include a blowing process or mechanical cleaning process in the exemplary embodiment 4 described above. By adding the blowing process or mechanical cleaning process of the exemplary embodiment in addition to supersonic cleaning described in the exemplary embodiments 1, 2 and 3, it is possible to remarkably improve the unnecessary material removing effect.

In each of the above exemplary embodiments, a through-hole is formed but it is not limited to making a through-hole. It is also possible to form a non-through-hole. Further, a conductive paste is used but it is not limited to using a conductive paste. It is also possible to use a conductive means such as metal-plating. In any of these cases, same effects as mentioned above can be obtained.

As described above, by the circuit board manufacturing method and apparatus of the present invention, a highly accurate hole is formed in a board material with film material as a mask bonded thereto. Further, unnecessary material such as foreign matter is selectively removed without peeling the film material off the film-coated board material. Accordingly, conductive material can be accurately disposed in the hole, using the film material as a mask. As a result, it is possible to obtain a low-cost highly reliable circuit board.

The invention claimed is:

1. A cleaning device to remove an unnecessary material from a film-coated board material to which the unnecessary material is sticking, wherein said film-coated board material comprises a board material and a film material as a mask bonded to said board material, said film material is bonded to said board material in a manner such that it can be removed from said film-coated board material, said unnecessary material is produced when a hole is formed in said film-coated board material, and said unnecessary material is sticking to said film-coated board material,
    said cleaning device comprises a cleaning tank;
    a cleaning solution provided in said cleaning tank;
    a supersonic oscillator installed in said cleaning solution;
    a feeding device which feeds said film-coated board material into said cleaning solution while retaining said film-coated board material; and
    a means for selectively removing said unnecessary material from said film-coated board material without peeling said film material;
    wherein said means for selectively removing said unnecessary material comprises
    a plurality of resonance control plates which hold said film-coated board material therebetween, and
    wherein the plurality of resonance control plates include at least one plate which internally has at least either an air layer or bubbles.

2. The cleaning-device as defined in claim 1, wherein said film-coated board material retained by said feeding device passes over the supersonic oscillator at a predetermined distance therefrom, said means for selectively removing said unnecessary material has said plurality of resonance control plates which hold said film-coated board material therebetween, a carrying means also serves as said plurality of resonance control plates, and said plurality of resonance control plates function to control the supersonic energy generated by the supersonic oscillator.

3. The cleaning device as defined in claim 2, wherein said plurality of resonance control plates has an area at least equivalent to that of said board material.

4. The cleaning device as defined in claim 2, wherein said plurality of resonance control plates includes at least one plate internally having at least one of an air layer and bubbles.

5. The cleaning device as defined in claim 2, wherein said feeding device includes upper and lower conveyors;
    said upper conveyor includes a first plurality of resonance control plates;
    said lower conveyor includes a second plurality of resonance control plates; and
    each of said first plurality of resonance control plates and each of said second plurality of resonance control plates pass over said supersonic element while holding said film-coated board material therebetween.

* * * * *